United States Patent [19]
Hatley, Jr.

[11] 4,044,241
[45] Aug. 23, 1977

[54] ADAPTIVE MATCHED DIGITAL FILTER

[75] Inventor: William T. Hatley, Jr., Sunnyvale, Calif.

[73] Assignee: ESL Incorporated, Sunnyvale, Calif.

[21] Appl. No.: 217,171

[22] Filed: Jan. 12, 1972

[51] Int. Cl.² .................................................. G06F 15/34
[52] U.S. Cl. .......................................... 235/152; 325/42; 333/18
[58] Field of Search ............... 235/152, 156; 333/17, 333/18, 28; 325/42

[56] References Cited

U.S. PATENT DOCUMENTS

| | | | |
|---|---|---|---|
| 3,508,153 | 4/1970 | Gerrish et al. | 325/42 |
| 3,521,042 | 7/1970 | Van Blerkom et al. | 235/156 |
| 3,524,169 | 8/1970 | McAuliffe et al. | 325/42 X |
| 3,597,541 | 8/1971 | Proakis et al. | 325/42 |
| 3,633,105 | 1/1972 | Lender et al. | 333/18 X |
| 3,651,316 | 3/1972 | Gibson | 333/18 X |
| 3,659,229 | 4/1972 | Milton | 333/18 |
| 3,665,171 | 5/1972 | Morrow | 235/152 |
| 3,676,804 | 7/1972 | Mueller | 333/18 |

Primary Examiner—David H. Malzahn
Attorney, Agent, or Firm—Limbach, Limbach, & Sutton

[57] ABSTRACT

A real time digital filter with its transfer function being matched to a particular signal plus noise condition in a manner that causes the transfer function to adapt to changing signal plus noise conditions. A transversal type of digital filter is disclosed. A general purpose computer calculates coefficients of the filter by continuously monitoring the input signal plus noise in order to maintain the filter's transfer function at an optimum level in view of changing noise conditions.

14 Claims, 3 Drawing Figures

SIGNAL PLUS NOISE INPUT

DESIRED SIGNAL

ADAPTIVE MATCHED DIGITAL FILTER

BACKGROUND OF THE INVENTION

This invention relates generally to techniques of electronically filtering a desired signal from undesired noise, and more specifically relates to linear digital filters.

A matched digital filter is basically a linear filter whose transfer function has been matched in some way to a particular electronic signal or environment in order to perform a filtering that is optimum for some particular purpose. The filter is particularly matched to a signal plus noise input from which the signal is desired to be extracted. A goal in the use of such filters is to accept a part of the incoming signal plus noise that is most representative of the signal contained therein.

One type of digital filter which has been used is a Fast Fourier Transform (FFT) digital filter. This type of filter suffers from a disadvantage of a large number of components which make it large and expensive. Prior digital filters, both the Fast Fourier Transform and others, have included means to manually adjust their transfer function but no provision has been made for continuously adapting the filter to a changing noise and signal environment.

Therefore, it is an object of the present invention to provide a method and apparatus of filtering electronic signals that is simple and less expensive than types presently employed.

It is an additional object of the present invention to provide a method and apparatus for filtering electronic signals that automatically adapts its transfer function to changing noise conditions.

SUMMARY OF THE INVENTION

These and additional objects of the present invention are realized by the use of a transversal type of digital filter whose multiplier coefficients are controlled and periodically updated by a digital computer. The computer samples incoming noise and signal at frequent intervals in order to monitor any changes in the noise environment. The computer rapidly calculates and sets optimum filter constants for a given noise environment.

The transversal filter is capable of exhibiting the same class of transfer function as a Fast Fourier Transform digital filter but requires far fewer components to build. Therefore, although a Fast Fourier Transform filter could be controlled by a computer according to the techniques of the present invention, a transversal digital filter is preferred. The use of a transversal digital filter in combination with a computer according to the present invention has the additional advantage that the computer needs to perform fewer calculations on the sampled input data in order to determine and set optimum filter constants.

The controlling computer can be programmed to bring about a wide variety of desired predetermined changes in the transfer function of the filter in response to a change in the incoming signal and noise. This technique has a general application in constructing time variable filters. In some cases, the filter transfer function can be changed every few hundred micro-seconds in response to changing input signal plus noise conditions. In the specific embodiment described hereinafter in detail with respect to the drawings, the situation is considered where something is known of the desired signal that is to be extracted from the signal plus noise. The computer is given this information of the desired signal. From this and the sampled noise plus signal input data to the computer, the filter constants are calculated in order to bring about a peak signal to noise ratio. This is especially useful in an application where the time of arrival of pulses is the information desired to be extracted rather than the exact shape of the signal waveform. A filter which maximizes the peak signal power with respect to the average noise power affords the optimum chance at detecting the presence of a pulse.

DESCRIPTION OF THE PREFERRED EMBODIMENT

Figure 1:
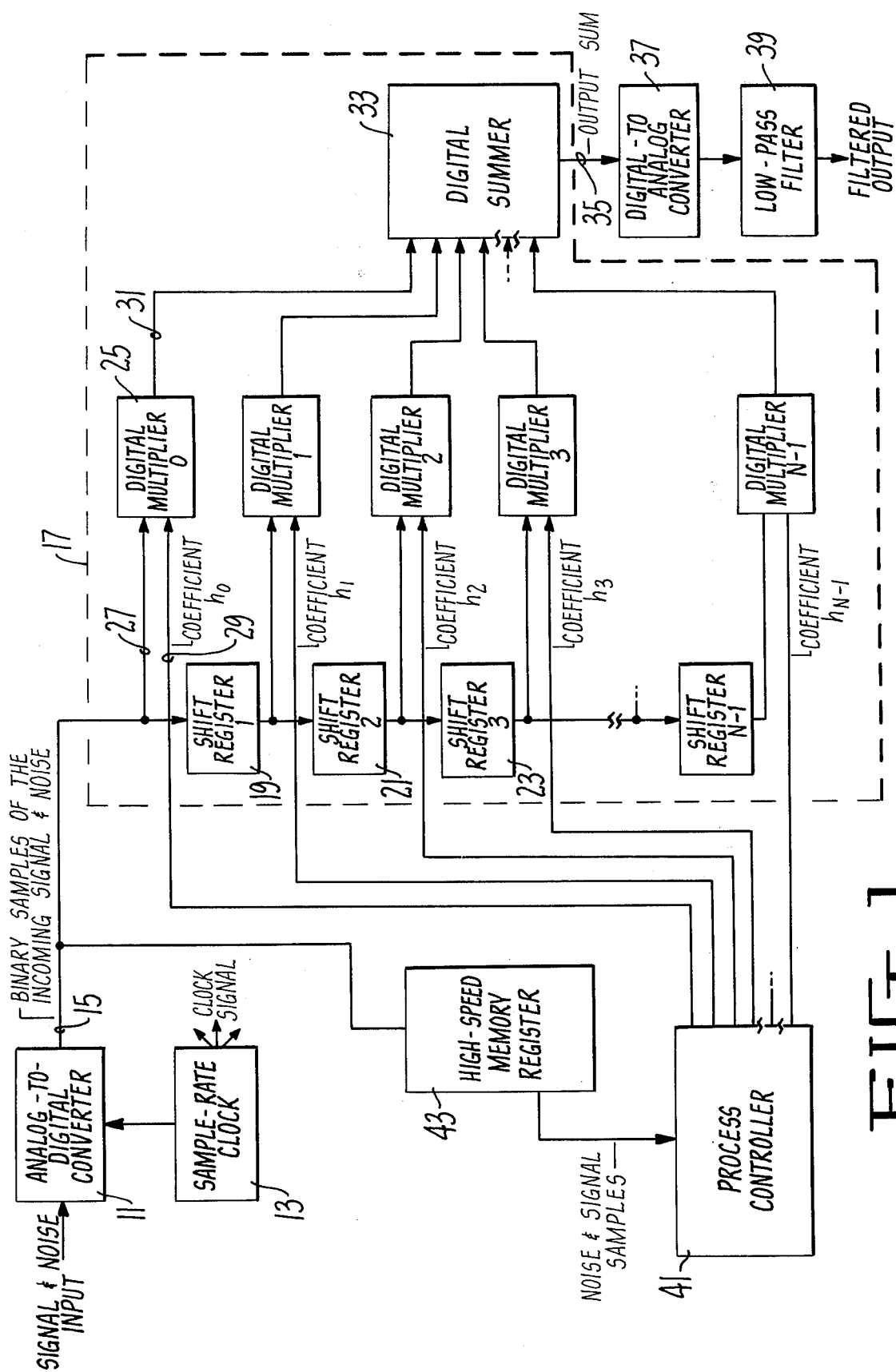
FIG. 1 is a simplified block diagram of the real time adaptive digital filter according to the present invention.

Referring to the block diagram of FIG. 1, an analog to digital converter 11 receives the signal and noise from which a signal is desired to be extracted at its input. A sample rate clock 13 is connected with the converter 11 so that the converter samples the input signal at periodic intervals. An output 15 of the analog to digital converter 11 then contains a train of samples separated by the time between the clock pulses of the sample rate clock 13 and having amplitudes expressed in the form of a binary code. This digital signal is then fed into the input of the transversal digital filter 17.

The transversal filter 17 includes a plurality of shift registers, such as shift registers 19, 21 and 23, which form a digital delay line. A binary sample at a given time that is developed in the line 15 is simultaneously inputted into the first shift register 19. Upon the next clock signal when a second sample is taken by the converter 11, the first sample is shifted out of the first shift register 19 and into the second shift register 21. The sample rate clock 13 is connected with each of the shift registers in order to move the samples down the shift register delay line. Similarly, upon the converter 11 taking a third sample, the first sample is shifted out of the second shift register 21 and into the third shift register 23 while the second sample is shifted out of the first shift register 19 and into the second shift register 21. Each digital sample of the incoming signal plus noise is thus moved along the digital delay line until it has passed through all of the shift registers within the transversal filter 17.

Also part of the transversal filter 17 is a plurality of digital multiplying circuits, one digital multiplier connected at each stage of the shift register. Referring to a zero digital multiplier 25, for instance, it is seen that there are two inputs, a first input 27 that is connected with the output line 15 of the converter 11, and a second input 29 which receives a binary multiplying coefficient $h_0$. An output 31 of the zero digital multiplier 25 at any given time is a binary product of the sample currently being taken by the converter 11 (and delivered at its output line 15) and the binary coefficient $h_0$. As the sample rate clock 13 advances, a given sample is multiplied by each constant $h_0, h_1, h_2, \ldots h_{N-1}$ at successive clock times as the sample is advanced along the shift registers. Each of the binary outputs of the plurality of multipliers is connected to a digital summer 33 which combines all the outputs to form an output of the transversal filter at a line 35 which is a binary representation of the desired signal. A digital to analog converter 37 converts the binary coded signal output into an analog signal. The analog signal is then passed through a low pass filter 39 to give the desired analog output.

Each of the shift registers of the transversal filter 17 should be capable of handling a full binary word that is representative of each sample. This may be, for instance, an eight bit word. That is, each of the samples at the converter output line 15 is eight bits long and each of the shift registers of the transversal filter 17 must be capable of storing eight bits in parallel. Similarly, in this particular sample, each digital multiplier of the transversal filter 17 must be capable of multiplying together two binary words that are each eight bits long. In such a case, the output of each digital multiplier will be a binary word that is 16 bits long. If an eight bit word is chosen for each data sample, in each of the coefficients inputted to the digital multipliers should also be an eight bit word.

The portion of the filter of FIG. 1 that has been described so far is capable of being optimized by manually setting the values of the binary coefficients $h_0$, $h_1$, etc., which are independently supplied to the digital multipliers of the transversal filter 17. Such a manual setting of these multiplying coefficients may be made in response to the signal plus noise input to the converter 11. However, such a technique does not allow for rapid adaptation of the filter coefficients to changing noise conditions. Therefore, if the coefficients of the transversal filter 17 are manually set so that the filter as a whole has an optimum transfer characteristic, a change in the noise characteristics of the input to the converter 11 will render the digital filter less than optimum for the new signal and noise characteristics.

Therefore, the filter according to the present invention, as shown in FIG. 1, includes a general purpose digital computer 41 which calculates and sets the various coefficients $h_0$, $h_1$, etc., independent of one another and supplies them to the appropriate multiplier inputs of the transversal filter 17, as shown in FIG. 1. The computer 41 receives as its input data a train of $n$ binary signal plus noise samples from the output line 15 of the converter 11. Since the sample rate clock 13 may operate faster than the clock of the computer 41, a high speed memory register 43 may be desirably interposed between the line 15 and the computer 41. The register has a capacity to store n successive binary samples from the converter as rapidly as they are produced. The register 43 is a collection of shift registers $n$ words long. Under command of the computer 41, the loading of the memory register 43 is stopped and its contents are read at a reduced speed compatible with the speed of the computer into the computer 41.

The computer 41 is a relatively small one that is commercially available. It can be programmed to optimize the overall transfer characteristics of the digital filter according to any number of useful criteria. One often desired characteristic is to maximize the peak signal to noise ratio of the output of the filter when something is known about the characteristics of the desired signal. This specific example is described with respect to FIGS. 2 and 3.

Figure 2:
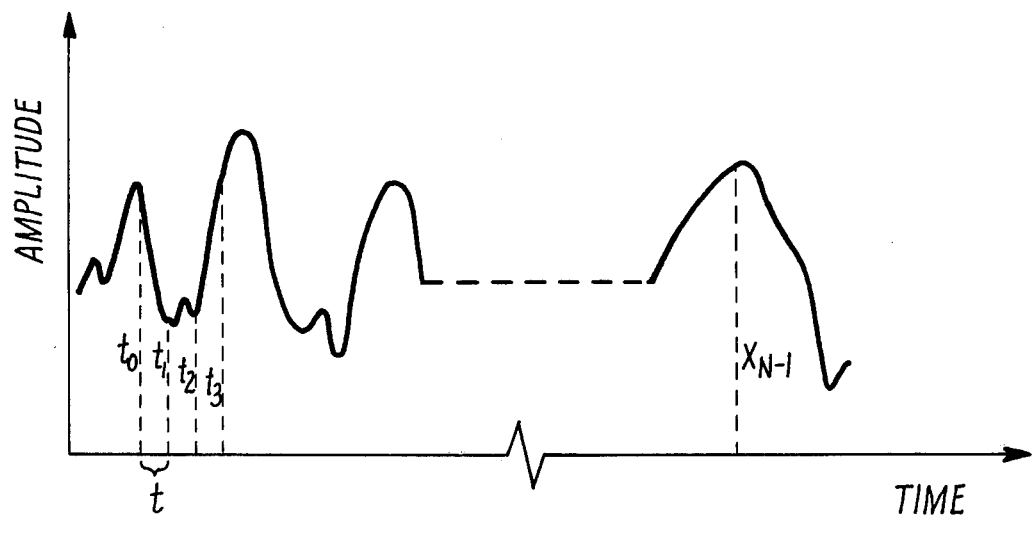
FIG. 2 is an example of a signal plus noise input to the digital filter of FIG. 1.

Referring to FIG. 2, a possible amplitude waveform of a signal plus noise input to the converter 11 of FIG. 1 is shown. The output of the converter 11 at the line 15 is a train of pulses separated by the period t of the sample clock 13. A certain number of these samples $x_0$, $x_1$, $x_2$, $x_3$ ... $x_{n-1}$ are fed into the computer 41 through the high speed memory register 43. This series of samples of the input signal plus noise is then used by the computer to calculate the optimum filter coefficients $h_0$, $h_1$, $h_2$, $h_3$ ... $h_{N-1}$.

Figure 3:
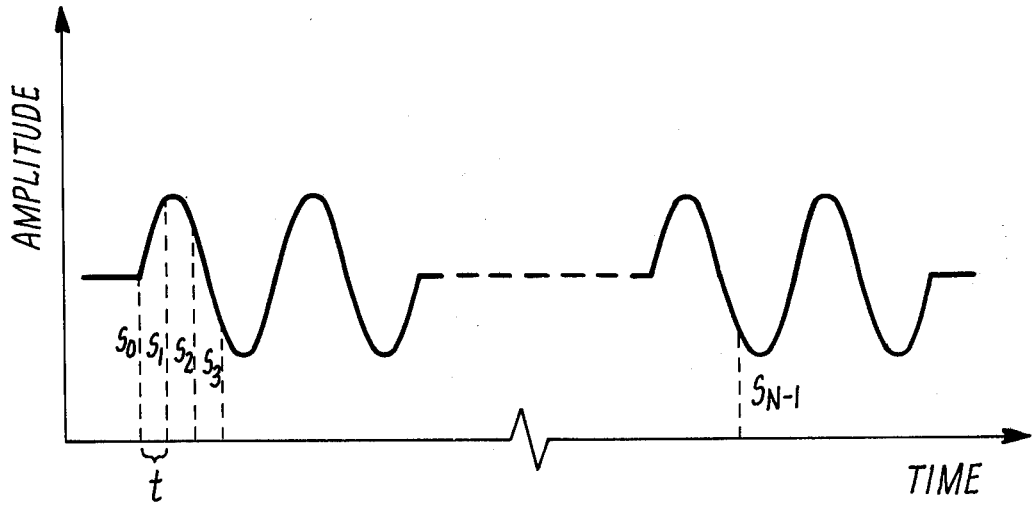
FIG. 3 shows an example of a signal that is desired to be detected by the digital filter of FIG. 1.

FIG. 3 shows an example of a signal that exists in the signal plus noise input that is desired to be detected at the output of the filter of FIG. 1. In the specific example shown in FIG. 3, successive pulses of radio frequency energy make up the desired signal. Information of this desired signal is also fed into the computer 41 in the form of binary samples $s_0$, $s_1$, $s_2$, $s_3$ ... $s_{n-1}$ that are taken of the desired signal with a period t between them. These samples can be introduced to the computer 41 as the result of a calculation or, alternatively, the desired signal can be fed into the analog to digital converter 11 without its noise background and samples thereof fed into the computer 41.

The computer 41 performs two basic operations in setting the coefficients $h_0$, $h_1$, $h_2$, $h_3$ ... $h_{N-1}$. The first step is to compute the auto-correlation of the sampled signal plus noise $x_0$, $x_1$, $x_2$, $x_3$ ... $x_{n-1}$, an operation consisting of a series of summations of products. The second operation required of the computer is that of solving a system of simultaneous linear equations, the number of equations being equal to the number of coefficients from which the individual coefficients may be determined by the computer. The following discussion will allow one ordinarily skilled in the art to properly program the computer 41 to carry out these specific functions.

The desired filter transfer characteristics in this specific example may be given by:

$$\hat{H} = C^{-1} S \tag{1}$$

where $\hat{H}$ is the optimum filter impulse response in the form of a vector representing the various filter coefficients $h_{N-1}$, $h_{N-2}$ ... $h_1$, $h_0$;

C is a covariance matrix; and

S is a vector representing desired signal samples $s_0$, $s_1$, $s_2$, $s_3$ ... $s_{n-1}$. The covariance matrix C is given by:

$$\begin{bmatrix} \phi_{xx}(0) & \phi_{xx}(1) & \phi_{xx}(2) \ldots \phi_{xx}(N-1) \\ \phi_{xx}(1) & \phi_{xx}(0) & \phi_{xx}(1) \ldots \phi_{xx}(N-2) \\ \phi_{xx}(2) & \phi_{xx}(1) & \phi_{xx}(0) \ldots \phi_{xx}(N-3) \\ \vdots & & \vdots \\ \phi_{xx}(N-1) & \ldots & \phi_{xx}(0) \end{bmatrix} \tag{2}$$

where $\phi_{xx}(0)$ is the auto-correlation of the binary sample signal $x_0$, $x_1$, $x_2$, $x_3$ ... $x_{n-1}$ unshifted;

$\phi_{xx}(1)$ is the auto-correlation of the binary sampled signal shifted t (one period between samples);

$\phi_{xx}(2)$ is the auto-correlation of the binary sampled signal shifted 2t; and $\phi_{xx}(N-1)$ is the auto-correlation of the binary sample signal shifted $(N-1)$ t.

Each of the auto-correlation values of equation (2) are calculated by multiplying the binary sampled signal function by itself when shifted some amount along the time scale. For each auto-correlation calculation, multiples of each of the binary sample values shifted a given amount are added together and divided by the number of sampled multiples. The first row of the matrix of equation (2) is determined in this manner. There will be a number of terms in the first row of the matrix of equation (2) equal to the number N of coefficients h that need to be calculated. Once the first row is determined, the remaining rows of the matrix of equation (2) are the same as the first row but shifted one position to the right. Enough of the matrix is given in equation (2) to indicate the pattern that is formed.

The number of samples $x_{n-1}$ that are taken of the incoming signal plus noise input in calculating the cross-correlations for the covariance matrix of equation (2) is several times the number N of coefficients h that need to be calculated to improve their accuracy. For instance, a particular design may include 64 multipliers which thus makes the integer N equal to 64. About four times this number, or $n = 256$, samples x are taken by the computer 41 from the signal plus noise input in order to calculate the covariance matrix C. Furthermore, this calculation is desirably performed several times, and the results of each auto-correlation function obtained in each of the calculations is averaged to give the values which are used to form the covariance matrix C of equation (2).

Once all of the necessary auto-correlation values have been calculated by the computer 41, a set of simultaneous equations equal to the number N of coefficients h is solved by the computer. These simultaneous equations as shown below are derived from substitution of the covariance matrix C of equation (2) in equation (1).

$$\phi_{xx}(0) \cdot h_{N-1} + \phi_{xx}(1) \cdot h_{N-2} + the...\phi_{xx}(2) \cdot h_1 + \phi_{xx}(N-1) \cdot h_0 = s_0$$

$$\phi_{xx}(1) \cdot h_{N-1} + \phi_{xx}(0) \cdot h_{N-2} + the...\phi xx(1) \cdot h_1 + \phi_{xx}(N-2) \cdot h_0 = s_1$$

$$\phi_{xx}(2) \cdot h_{N-1} + \phi_{xx}(1) \cdot h_{N-2} + the...\phi_{xx}(0) \cdot h_1 + \phi_{xx}(N-3) \cdot h_0 = s_2$$

The desired signal samples $s_0, s_1, s_2$, etc. on the right hand side of equation (3) are known from the desired signal, as shown in FIG. 3. Each of the auto-correlation $\phi_{xx}(0), \phi_{xx}(1)$, etc. have been calculated. The equations (3) are then solved for the desired coefficients $h_0, h_1$, etc., and the result of the calculation is independently fed to each of the digital multipliers of the transversal filter 17. This entire calculation can be performed rapidly and thus as often as desired in order to constantly change the coefficients to conform to changing noise conditions of the input signal plus noise to the analog to digital converter 11.

The above discussion has assumed that the desired signal is known as a function of time. However, in some applications, this information may not be known with such certainty. In another application of the techniques of this invention, an estimate of the signal spectrum amplitude can be used to form a minimum mean square error filter. In this case, an auto-correlation of the signal spectrum is calculated just once. The computer then uses the auto-correlation values for $s_0, s_1, s_2$, etc. of equation (3) above in calculating the constants of the filter multiplier stages. This calculation need not be made again until the estimated signal spectrum changes.

The techniques of the present invention have been described with respect to a specific example thereof, but it is understood that many variations are possible within the scope of the appended claims.

I claim:

1. An electronic filter, comprising,
    means receiving an electronic noise plus signal waveform for sampling said waveform at periodic intervals with the amplitude of each waveform sample expressed in a binary code,
    a digital filter receiving the binary waveform samples at an input and forming a filtered binary signal at an output, said filter having a transfer function that is controllable by application of a plurality of binary constants thereto, and
    means receiving said input binary samples for automatically generating said transfer function controlling filter binary constants and continuously conforming said constants to changes in said noise plus signal waveform.

2. Apparatus according to claim 1 wherein said digital filter includes a transversal type linear filter.

3. Apparatus according to claim 1 where said means for generating said filter constants includes a general purpose digital computer.

4. Apparatus according to claim 3 wherein said digital computer is preprogrammed with a desired signal to be extracted from said noise plus signal waveform, said preprogrammed desired signal being used in determining said filter constants.

5. An electronic apparatus for filtering a time varying electronic input signal that includes a desired signal plus undesired noise, comprising,
    an analog-to-digital converter which samples said input signal at periodic intervals and produces a serial output of samples, each sample including a parallel binary word representation of the magnitude of the sample,
    a common clock pulse source connected to said analog-to-digital converter for controlling the periodic interval at which said samples are made,
    a delay line including a plurality of stages connected to said analog-to-digital converter to receive the binary samples, said common clock source connected to said delay line for moving the individual binary word samples along said delay line through one stage at each clock pulse,
    a digital multiplier associated with each delay line stage, each multiplier having two binary data inputs and an output which generates a binary multiple of the two inputs, one of said inputs of each multiplier connected to receive the sample at its associated stage of the delay line and the other of each input of each multiplier connected to receive a distinct constant in the form of a binary word, the value of the binary word constants determining the transfer function of the electronic filter,
    means receiving said binary samples at the output of the analog-to-digital converter for automatically determining and setting the individual binary word constants at each digital multiplier whereby the transfer function of the electronic filter is set in response to the input signal,
    a digital summer receiving the digital outputs of each of the multipliers and forming a common digital output, and
    a digital-to-analog converter connected to said summer which forms the filter output.

6. Apparatus according to claim 5 wherein each stage of said delay line includes a digital shift register.

7. Apparatus according to claim 5 wherein said means for determining said multiplier constants includes a digital computer.

8. Apparatus according to claim 7 that additionally comprises a shift register at the input of said computer for receiving a series of binary input signal samples from said analog-to-digital converter and feeding said samples into the computer at a rate that is less than the rate of said common clock source.

9. A method of filtering a time varying signal plus noise, comprising the steps of:
sampling said signal plus noise at a given periodic rate and converting said samples into a binary representation of the amplitude thereof,
passing said binary samples serially along a delay line of a plurality of stages, said samples being advanced along said delay line from one stage to another at said periodic rate,
simultaneously multiplying each of the binary samples at every stage along said delay line by a distinct binary constant,
automatically calculating and setting the distinct binary constants from said binary samples of said signal plus noise,
digitally summing all multiples, and
converting the digital summation to a time varying analog signal as the output of the filter.

10. A method of filtering a time varying signal plus noise, comprising the steps of:
sampling said signal plus noise at a given periodic rate and converting said samples into a binary representation of the amplitude thereof,
passing said binary samples serially along a delay line of a plurality of stages, said samples being advanced along said delay line from one stage to another at said periodic rate,
simultaneously multiplying each of the binary samples at every stage along said delay line by a distinct binary constant,
automatically calculating and setting the distinct binary constants from said binary samples of said signal plus noise, said step of automatically calculating including the steps of:
extracting a series of binary data samples in excess of the number of constants to be calculated and set,
determining auto-correlations of the sampled signal for shifts of various multiples of said periodic rate including zero through the number of constants to be calculated,
sampling a desired signal at said periodic rate,
establishing a plurality of simultaneous equations equal in number to at least the number of constants to be calculated, each of said equations including a desired signal sample and a plurality of terms where an auto-correlation value is multiplied by one of the constants being determined, and
solving the plurality of simultaneous equations for said constants,
digitally summing all multiples, and
converting the digital summation to a time varying analog signal as the output of the filter.

11. A method of filtering binary data of a desired signal, comprising the steps of:
passing only said binary data serially along a delay line of a plurality of stages,
simultaneously multiplying the binary data at every stage along said delay line by a distinct binary constant,
automatically calculating and setting the distinct binary constants from at least some of the same binary data of the desired signal that is fed to the delay line,
digitally summing all multiples of the binary data to form a filtered binary output signal.

12. An adaptive digital filter, comprising:
a digital delay line having a plurality of serially connected stages from an input,
a digital multiplier associated with each delay line stage, each multiplier characterized by two binary data inputs and an output that delivers a binary multiple of the two inputs, one of said inputs of each multiplier being connected to receive the binary content at its associated stage of the delay line and the other of each input of each multiplier connected to receive a distinct binary constant, whereby the value of all the binary constants determines the transfer function of the adaptive digital filter,
a general purpose digital computer connected to said delay line input for calculating and setting values of said binary constants from at least some of the binary data that appears at the delay line input, said computer having a plurality of outputs with one output connected to each of said other inputs of the multipliers, and
a digital summer receiving the digital outputs of all the multipliers and forming a filtered digital output.

13. The adaptive digital filter of claim 12 wherein said general purpose digital computer is connected to periodically receive a plurality of binary samples of a signal plus noise at said input, the number of said samples being several times the number of said digital multiplier, said computer additionally being connected to first compute the auto-correlation of said plurality of binary samples and then secondly to solve a number of simultaneous linear equations equal to the number of said digital multipliers and which each relate the auto-correlations of said samples with said binary constants, whereby said binary constants are determined.

14. The adaptive digital filter of claim 12 wherein each of said digital delay line stages includes a parallel eight bit storage element and wherein there are sixty-four of said digital multipliers.

* * * * *